(12) United States Patent
Nakayama et al.

(10) Patent No.: US 7,339,823 B2
(45) Date of Patent: Mar. 4, 2008

(54) NONVOLATILE SEMICONDUCTOR STORAGE APPARATUS AND METHOD OF DRIVING THE SAME

(75) Inventors: Masayoshi Nakayama, Shiga (JP); Asako Miyoshi, Shiga (JP); Seiji Yamahira, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/544,608

(22) Filed: Oct. 10, 2006

(65) Prior Publication Data

US 2007/0086245 A1 Apr. 19, 2007

(30) Foreign Application Priority Data

Oct. 17, 2005 (JP) ............................. 2005-301534

(51) Int. Cl.
*G11C 11/34* (2006.01)
(52) U.S. Cl. .............................. 365/185.11; 365/185.24
(58) Field of Classification Search ........... 365/185.11, 365/185.24
See application file for complete search history.

(56) References Cited

U.S. PATENT DOCUMENTS 6,307,398 B2 10/2001 Merritt et al.
6,421,754 B1* 7/2002 Kau et al. ................... 710/261
6,606,269 B2* 8/2003 Roohparvar ........... 365/185.33
2005/0083772 A1* 4/2005 Roohparvar et al. ........ 365/232
2005/0122803 A1 6/2005 Yamada et al.

FOREIGN PATENT DOCUMENTS

JP 2001-210082 3/2001

* cited by examiner

*Primary Examiner*—Michael T Tran
(74) *Attorney, Agent, or Firm*—McDermott Will & Emery LLP

(57) ABSTRACT

A memory cell array is logically divided into a plurality of regions having different reading speeds, the respective regions having the different reading speeds include region information storage regions for storing region information in which at least two addresses present in the memory cell at the same time are set to be different regions, a reading control circuit is constituted to carry out a reading operation by determining any of the divided regions which is to be read, selecting an optimum reading method and controlling the reading circuit based on the region information stored in the region information storage region, and an address which can be read in a short time in multivalued information stored in one memory cell is set to be a high speed reading region and is distinguished from regions having the other reading speeds. Consequently, it is possible to efficiently write and read information of 2 bits or more in one memory cell array without reducing a using efficiency of the memory cell array.

9 Claims, 12 Drawing Sheets

NONVOLATILE SEMICONDUCTOR STORAGE APPARATUS AND METHOD OF DRIVING THE SAME

BACKGROUND OF THE INVENTION

1. Field of the Invention

The present invention relates to a nonvolatile semiconductor storage apparatus and a method of driving the same, and more particularly to a driving operation of an electrically writable/erasable nonvolatile semiconductor storage apparatus capable of storing information of 2 bits or more in one memory cell.

2. Description of the Related Art

An electrically writable/erasable nonvolatile semiconductor storage apparatus (flash memory) has spread for storing a program code. In recent years, in addition to the uses, uses for storing mass data such as image data, voice data or animation data have been demanded and a further increase in a capacity has been required.

In a system such as a cell phone, moreover, there has been demanded a flash memory capable of implementing, in one chip, a storage of a program code demanded to have an increase in a reading speed and various data required to have an increase in a capacity in order to reduce a mounting region and a cost by a decrease in the number of components.

As a technique for implementing a further increase in a capacity of a flash memory, attention has been paid to a technique for a multivalue in addition to the microfabrication of a semiconductor processing technique.

In case of an ordinary binary flash memory, a threshold of a memory cell is set into two states, and a high state is caused to correspond to "0" (or "1") and a low state is caused to correspond to "1" (or "0").

On the other hand, a four-valued flash memory will be considered as an example of a flash memory using the multivalue technique. Referring to a flash memory for storing 2-bit information in one memory cell, a conventional reading method of the flash memory using the multivalue technique will be described below with reference to FIGS. 10, 11, 12 and 13.

In reading, usually, when a power supply is turned ON (Step 1001) and a reading address is input (Step 1002), a memory cell corresponding to the reading address is selected (Step 1003) and a reading operation is carried out (Step 1004) as shown in a flowchart of FIG. 10.

In FIG. 11, characteristic curves 1101, 1102, 1103 and 1104 indicate Ids-Vgs characteristics in each threshold of the memory cell.

In the four-valued flash memory, a state in which "1" is stored in an address A1 and "1" is stored in an address A2 is set to be a state of the smallest threshold shown in the characteristic curve 1101.

In ascending order of the threshold, subsequently, a state in which "1" is stored in the address A1 and "0" is stored in the address A2 is set to be a threshold of the characteristic curve 1102, a state in which "0" is stored in the address A1 and "0" is stored in the address A2 is set to be a threshold of the characteristic curve 1103, and a state in which "0" is stored in the address A1 and "1" is stored in the address A2 is set to be a threshold of the characteristic curve 1104.

Referring to the reading operation of the multivalued flash memory thus set, for example, as shown in a voltage transition 1201 of Vgs-t of FIG. 12, a gate-source voltage of the memory cell is raised stepwise in order of Vgs1, Vgs2 and Vgs3, and it is decided whether a current Ids between a drain and a source which flows to the memory cell in an input of each Vgs is larger or smaller than a preset current and the decision is read. In case of such a reading operation, a correspondence of a result of a decision of a state in which the current flows (ON state) and a state in which the current does not flow (OFF state) in the input of each Vgs to information stored in the addresses A1 and A2 is shown in a table of 1202.

As another means for the reading operation of the multivalued flash memory, for example, a transition is carried out as shown in a voltage transition 1301 of Vgs-t in FIG. 13. Consequently, a correspondence of the result of the decision of the ON state and the OFF state which is obtained in the input of each Vgs to the information stored in the addresses A1 and A2 is shown in a table 1302 in the same manner as in the table 1202 of FIG. 12. More specifically, it is possible to decide whether data in the address A1 are "1" or "0" by deciding a current obtained when Vgs2 is input. By deciding currents when Vgs3 and Vgs1 are input, then, it is decided whether data in the address A2 are "1" or "0".

As described above, various methods can be proposed for the reading operation of the multivalued flash memory. In the case in which 2-bit information in the addresses A1 and A2 are read, it is necessary to change the voltage Vgs three times and to decide the current in the method described with reference to FIG. 12, and to change the voltage Vgs twice at a maximum and to decide the current in the method described with reference to FIG. 13. For this reason, a reading speed is limited, and there is a problem in the case in which a program code requiring a high speed reading operation and various data requiring an increase in a capacity are stored in one memory cell array, for example.

In order to enhance a reading performance and a reading reliability, moreover, it is possible to improve the performance by setting a voltage difference in each threshold storing information to be great. In the multivalued flash memory, it is hard to maintain the voltage difference in the threshold thus set as compared with the binary flash memory.

As means for solving these problems, JP-A-2001-210082 Publication has disclosed a method of implementing, in one memory cell array, a program code requiring a high reading speed and various data requiring a large capacity by using, as a binary flash memory, a memory cell in a region requiring a high speed reading performance and using, as a multivalued flash memory, a region requiring a large capacity.

In the case in which the multivalued flash memory is used, it is necessary to change a Vgs voltage of a memory cell plural times in order to read a large number of bits stored in one memory cell, and furthermore, to decide a current. For this reason, a reading speed is reduced.

On the other hand, in a method using, as a binary flash memory, a region requiring a high speed reading operation and using, as a multivalued flash memory, a region requiring a large capacity, it is possible to suppress a reduction in the reading speed. In the region for the use as the binary flash memory, 1-bit information is stored. Consequently, a using efficiency of a memory cell array is reduced so that an increase in a chip area cannot be avoided.

SUMMARY OF THE INVENTION

In consideration of the actual circumstances, it is an object of the invention to provide a nonvolatile semiconductor storage apparatus capable of implementing, in one memory cell array, a region requiring a high speed reading operation and a region requiring a large capacity without reducing a using efficiency of a memory cell array.

Moreover, it is an object of the invention to freely set regions having different reading performances.

In a nonvolatile semiconductor storage apparatus according to the invention, therefore, for memory cells capable of storing information of 2 bits or more in one memory cell, at least two addresses present in the same memory cell are treated as regions having different reading speeds, respectively.

More specifically, the invention provides a nonvolatile semiconductor storage apparatus comprising a memory cell array including a plurality of memory cells capable of storing information of 2 bits or more in one memory cell, a writing control circuit for controlling a writing operation to the memory cell array, an erasing control circuit for controlling an erasing operation, a reading control circuit for controlling a reading operation, and a reading circuit capable of applying a plurality of reading methods, wherein the memory cell array is logically divided into a plurality of regions having different reading speeds and the respective regions having the different reading speeds include region information storage regions for storing region information in which at least two addresses present in the memory cell at the same time are set to be different regions, and the reading control circuit is constituted to carry out a reading operation by determining any of the divided regions which is to be read, selecting an optimum reading method and controlling the reading circuit based on the region information stored in the region information storage region.

According to the structure, an address which can be read in a short time in multivalued information stored in one memory cell is set to be a high speed reading region and is distinguished from regions having the other reading speeds. Consequently, it is possible to efficiently write and read information of 2 bits or more in one memory cell array without reducing a using efficiency of the memory cell array.

By deciding whether a required reading address is a high speed reading region or the regions having the other reading speeds by using information stored in a region information storage region which is prepared separately and selecting a suitable reading method for the same region, the reading operation of the memory cell is executed.

In the case in which erasing and writing operations are carried out, moreover, information which does not require the erasing and writing operations in the memory cell is transferred to a data saving memory which is separately prepared. Consequently, it is possible to carry out the erasing and writing operations for an optional region.

In a plurality of reading regions present in one memory cell, furthermore, a voltage difference in a threshold to be used when reading a high speed reading region is set to be greater than a voltage difference in a threshold to be used when reading the regions having the other reading speeds. As compared with the fact that the same processing is carried out for a conventional multivalued flash memory, consequently, it is possible to set the voltage difference to be greater. Thus, it is possible to enhance a high speed reading performance and a reliability.

By setting the region information storage region to have an electrically writable/erasable structure, moreover, it is possible to change a capacity of each region after a shipment of a product.

Moreover, a plurality of regions is provided for each erasing unit or each word line. Consequently, the degree of freedom of region setting is increased. In the case in which information of 3 bits or more is stored in one memory cell and the case in which a reading speed can be switched into three types or more, furthermore, it is possible to set reading speeds in a plurality of combinations.

In the case in which a plurality of regions is provided for each erasing unit or each word line, furthermore, a part of memory cells in a corresponding region in the memory cell array is used as the region information storage region. Consequently, it is possible to enhance a storage efficiency in the region information storage region.

Moreover, the invention provides a method of driving a nonvolatile semiconductor storage apparatus comprising a memory cell array including a plurality of memory cells capable of storing information of two bits or more in one memory cell, comprising the steps of logically dividing the memory cell array into a plurality of regions having different reading speeds and storing, in a region information storage region, region information in which the respective regions having the different reading speeds set at least two addresses present at the same time in the memory cell to be different regions, determining to read any of the divided regions based on the region information stored in the region information storage region, and selecting an optimum reading method for the region determined at the determining step and carrying out a reading operation.

According to the invention, it is possible to obtain the following advantages.

At least two addresses present in the same memory cell are treated as the regions having the different reading speeds respectively, and an address which can be read in a short time is set to be a high speed reading region and is distinguished from the regions having the other reading speeds, and is thus read. Consequently, it is possible to carry out an implementation in one memory cell array without reducing a using efficiency of the memory cell array.

In the case in which erasing and writing operations are carried out for a part of information, information which does not require the erasing and writing operations in the memory cell is previously transferred to the data saving memory which is separately prepared. Consequently, it is possible to carry out the erasing and writing operations for an optional region.

In a plurality of reading regions present in one memory cell, a voltage difference in a threshold to be used when reading a high speed reading region is set to be greater than a voltage difference in a threshold to be used when reading the regions having the other reading speeds. Thus, it is possible to enhance a high speed reading performance and a reliability.

By setting the region information storage region to have an electrically writable/erasable structure, it is possible to change a capacity of each region after a shipment of a product.

Moreover, a plurality of regions is provided for each erasing unit or each word line. Consequently, the degree of freedom of region setting is increased. In the case in which information of 3 bits or more is stored in one memory cell and the case in which a reading speed can be switched into three types or more, furthermore, it is possible to set reading speeds in a plurality of combinations.

In the case in which a plurality of regions is provided for each erasing unit or each word line, furthermore, a part of memory cells in a corresponding region in the memory cell array is used as the region information storage region. Consequently, it is possible to enhance a storage efficiency in the region information storage region and to reduce a chip area.

DESCRIPTION OF THE PREFERRED EMBODIMENTS

Embodiments according to the invention will be described below in detail with reference to the drawings.

Figure 1:
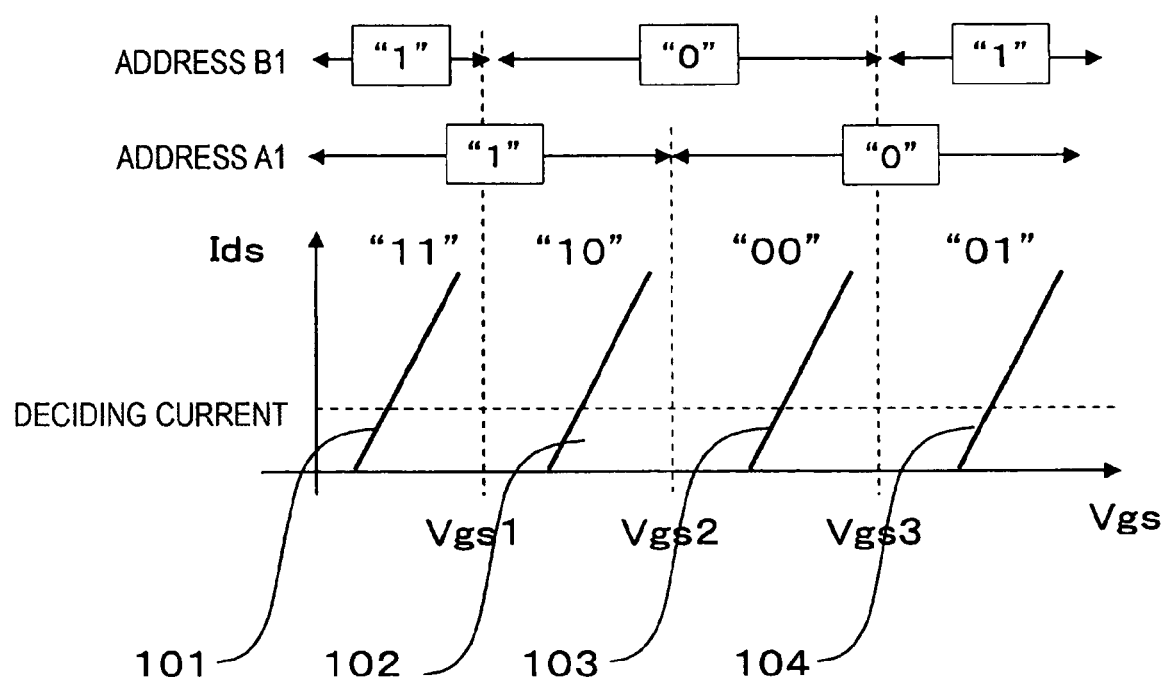
FIG. 1 is a chart showing setting of a threshold of a multivalued flash memory capable of storing 2-bit information in one memory cell and an Ids-Vgs characteristic corresponding to information stored in each address in a flash memory according to a first embodiment of the invention.

FIG. 1 is a chart showing setting of a threshold of a memory cell in a multivalued flash memory according to the invention.

FIG. 1 shows a flash memory for storing four values, and a state in which "1" is stored in an address A1 and "1" is stored in an address B1 is set to be a state of the smallest threshold indicated as an Ids-Vgs characteristic 101 shown in FIG. 1, and a state in which "1" is stored in the address A1 and "0" is stored in the address B1 is set to be each threshold of an Ids-Vgs characteristic 102, a state in which "0" is stored in the address A1 and "0" is stored in the address B1 is set to be each threshold of an Ids-Vgs characteristic 103, and a state in which "0" is stored in the address A1 and "1" is stored in the address B1 is set to be each threshold of an Ids-Vgs characteristic 104 in ascending order of the threshold.

The address A1 in which it is possible to decide whether a gate-source voltage Vgs to be applied to a memory cell in a reading operation is "0" or "1" by inputting only one voltage of Vgs2 is set to be a region in which high speed reading can be carried out, and the address B1 in which it is possible to decide whether Vgs is "0" or "1" for the first time by inputting two voltages of Vgs1 and Vgs3 is set to be a region having a normal reading speed.

Figure 2B:
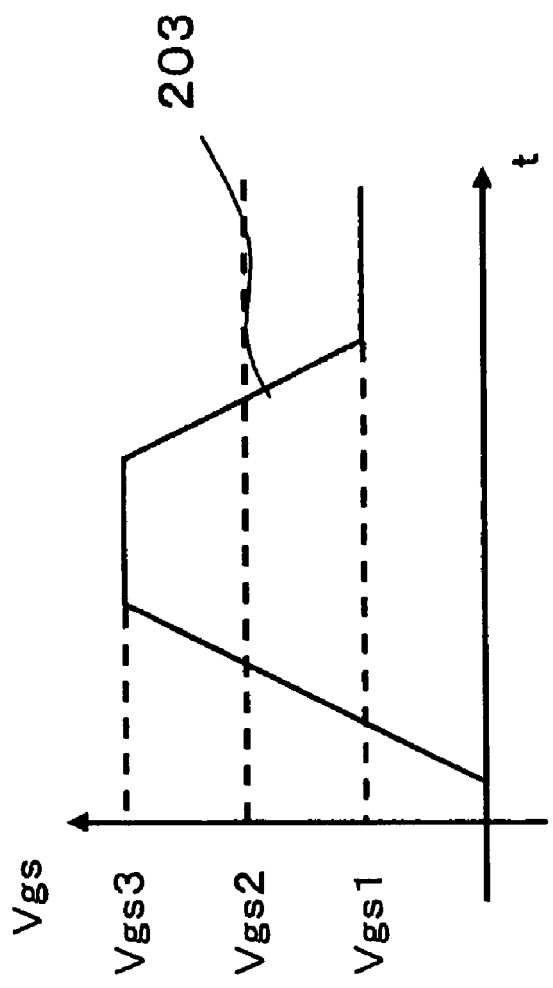
FIG. 2 is a chart showing a Vgs-t transition in an execution of a reading operation and a correspondence of a state of Ids in each Vgs to stored information for two addresses assigned into the memory cell in FIG. 1.
Figure 2A:
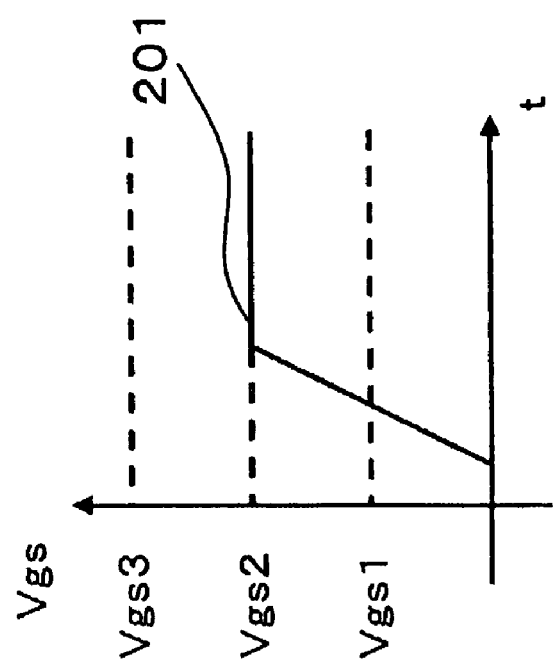

In FIG. 2, in the case in which the address A1 is read, the reading operation is carried out in a transition of Vgs-t indicated as 201. In the case in which Vgs2 is input, the address A1 is determined as "1" in a state in which a current flows ("ON" state) and the address A1 is determined as "0" in a state in which the current does not flow ("OFF" state). 202 denotes the correspondence described above.

On the other hand, in the case in which the address B1 is read, a reading operation is carried out in a transition of Vgs-t indicated as 203. The address B1 is determined as "1" in the "ON" state when Vgs3 is input and in the "OFF" state when Vgs1 is input, and is determined as "0" in the "OFF" state when Vgs3 is input and in the "ON" state when Vgs1 is input. 204 denotes the correspondence described above.

As described above, it is necessary to change Vgs twice and to decide a current in order to read the address B1, while it is possible to carry out a reading operation by changing Vgs once and deciding the current in order to read the address A1. By setting the address A1 to be a region in which a high speed reading operation can be carried out and setting the address B1 to be a region having a normal reading speed, it is possible to implement regions having different reading speeds in one memory cell array.

Figure 3:
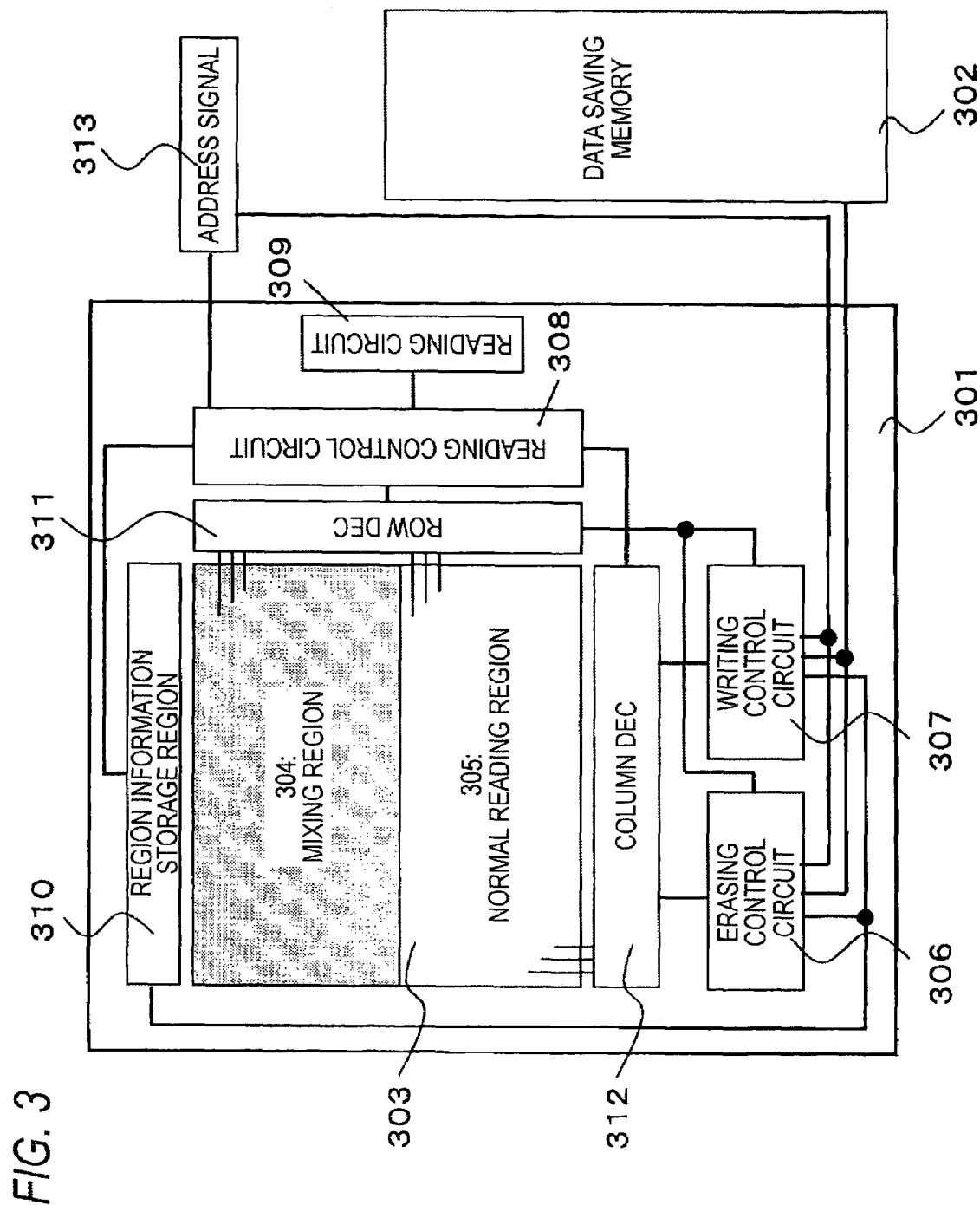
FIG. 3 is a diagram showing a structure for implementing a high speed readable region and a region having a normal reading speed in one flash memory chip.

FIG. 3 is a diagram showing a structure of a flash memory according to the embodiment.

The flash memory according to the embodiment is constituted by a flash memory chip 301 and a data saving memory 302 for once saving data in writing as shown in FIG. 3, and the flash memory chip 301 and the data saving memory 302 are constituted by separate memory chips.

The flash memory chip 301 includes a memory cell array 303, and is constituted by a memory cell array including a plurality of multivalued memory cells which can store 2-bit information in one memory cell. The memory cell array 303 includes a mixing region 304 in which a high speed reading region and a region having a normal reading speed are mixed. The threshold of the memory cell and the region are set as described with reference to FIG. 1.

Furthermore, the memory cell array 303 represents a normal reading operation region 305 having a normal reading speed.

Furthermore, the flash memory chip 301 includes an erasing control circuit 306 for erasing the memory cell array 303, a write control circuit 307 for carrying out write to the memory cell array 303, and a reading control circuit 308 for carrying out a reading operation over the memory cell array 303, and a method of controlling a reading circuit 309 is selected.

A region information storage region 310 stores information for discriminating the mixing region 304 and the normal reading region 305 in the memory cell array 303.

Moreover, a Row decoder 311 serves to select a word line of the memory cell array 303 and a Column decoder 312 serves to select a bit line.

Figure 6:
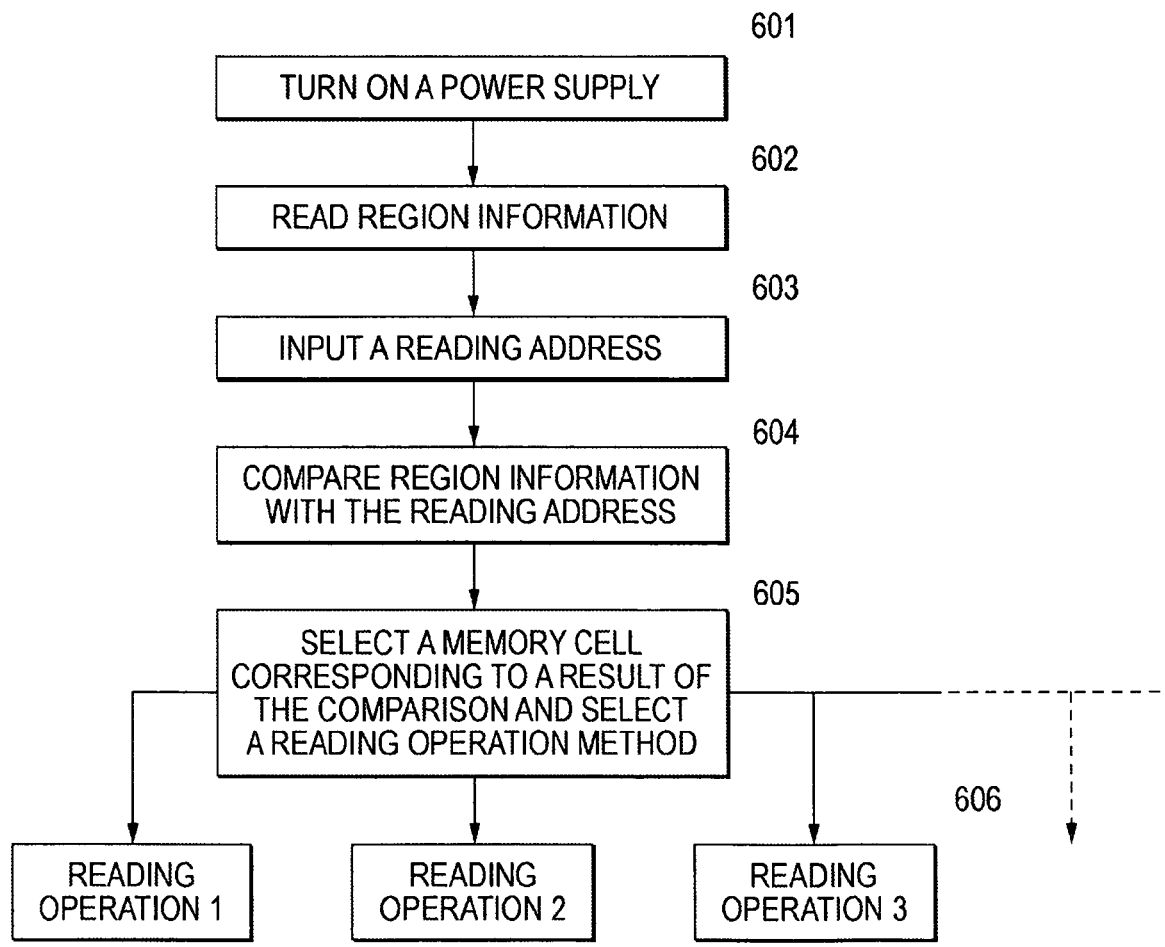
FIG. 6 is a flowchart showing the reading operation of the flash memory according to the first embodiment of the invention.

Moreover, an address signal 313 serves to specify an address for carrying out each of reading, erasing and writing operations for the flash memory chip 301;

A specific operation will be described below. FIG. 6 is a flowchart showing the embodiment.

Figure 4:
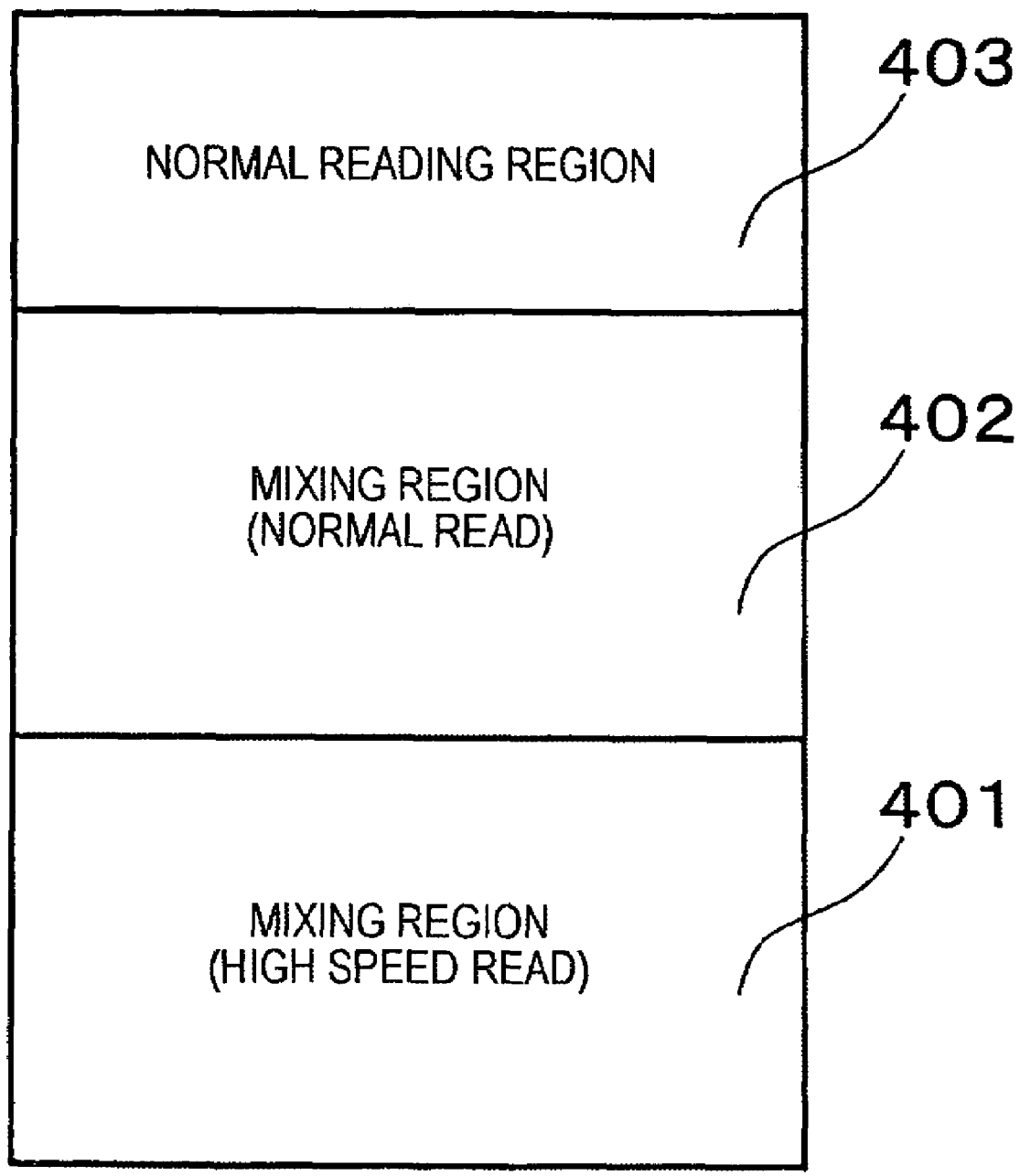
FIG. 4 is a typical diagram showing each of regions having different reading speeds which are divided in a memory cell array in FIG. 3.

FIG. 4 typically represents each of regions having different reading speeds in the memory cell array 303. When a power is turned ON (Step 601), region information is first read (Step 602). There are shown a high speed reading region 401 in the mixing region 304 and a normal reading region 402 in the mixing region 304. Moreover, a normal reading region 403 corresponds to the normal reading operation region 305, and the memory cell array 303 is a total of 401, 402 and 403.

For such a structure, in a reading operation, an address to be a reading target is specified by the address signal 313 and is input to the reading control circuit 308 (an input of a reading address: Step 603).

Figure 5C:
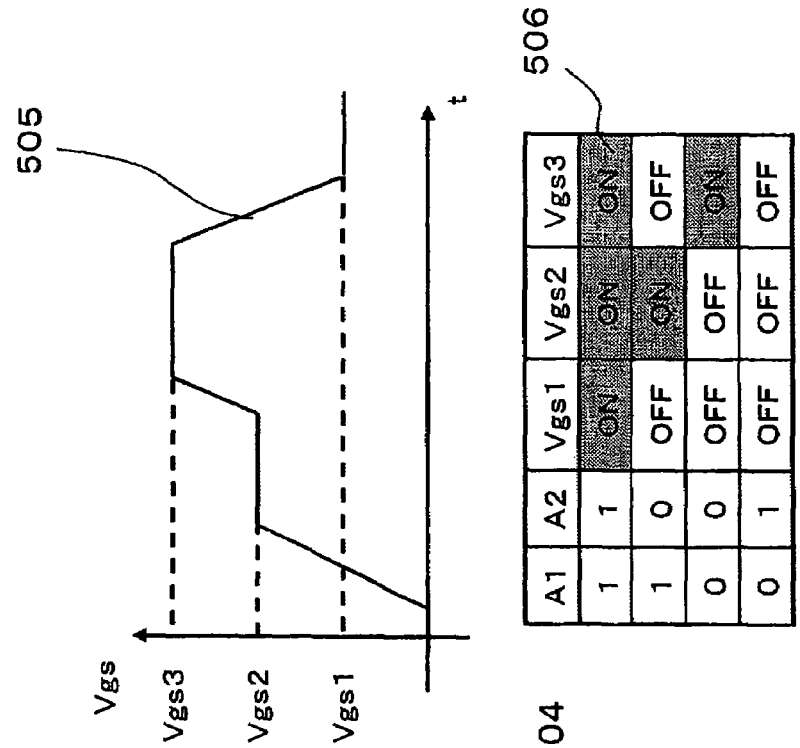
FIG. 5 is a chart showing a Vgs-t transition in the case in which a reading operation is carried out for each region and a correspondence of a state of Ids in each Vgs to the stored information in FIG. 4.
Figure 5B:
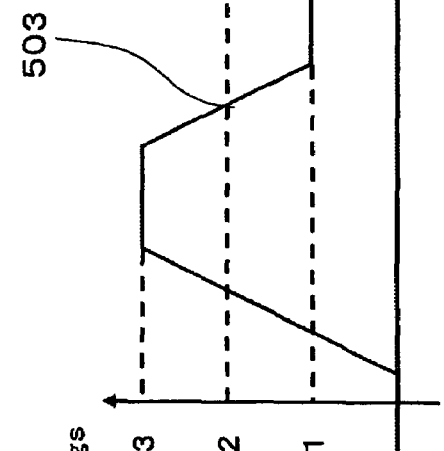
Figure 5A:
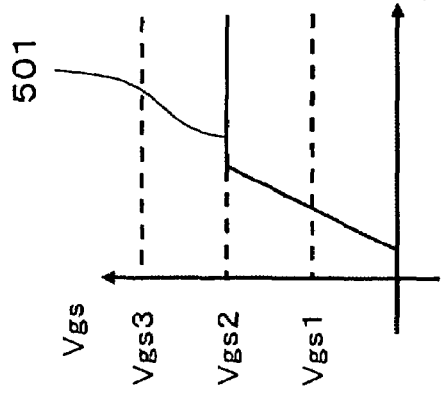

Next, information of the region information storage region 310 storing an address to be a boundary among the reading regions, that is, the normal reading region 401, the mixing region (normal reading region) 402 and the mixing region (high speed reading region) 403 divided in the memory cell array 303 is compared with the address signal 313 by the reading control circuit 308 (the comparison of the region information with the reading address: Step 604), it is decided whether any of the normal reading region 401, the mixing region (normal reading region) 402 and the mixing region (high speed reading region) 403 is designated by an address indicated by the address signal 313, a reading method of the reading circuit 309 is set, and a specific reading operation is carried out by a method which will be described below (a selection of a memory cell corresponding to a result of the comparison and a selection of a reading method: Step 605). FIG. 5 shows a reading method for each of the normal reading region 401, the mixing region (normal reading region) 402 and the mixing region (high speed reading region) 403 indicated by the address signal 313.

In FIG. 5, in the case in which the reading operation is carried out for the high speed reading region 403 in the mixing region, a Vgs voltage shown in a Vgs-t transition 501 is input to perform the reading operation.

At this time, a correspondence of a result of a decision of a current in a memory cell obtained when each Vgs is input to information stored in the address A1 is indicated as 502.

In the case in which the reading operation is carried out for the normal reading region 402 in the mixing region, moreover, a Vgs voltage indicated as a Vgs-t transition 503 is input to carry out the reading operation (reading operation: Step 606).

At this time, a correspondence of the result of the decision of the current in the memory cell obtained when each Vgs is input to information stored in the address B1 is indicated as 504.

In the case in which the reading operation is carried out for the normal reading region 401, moreover, a Vgs voltage indicated as a Vgs-t transition 505 is input to carry out the reading operation.

At this time, a correspondence of the result of the decision of the current in the memory cell obtained when each Vgs is input to the information stored in the addresses A1 and B1 is indicated as 506.

By carrying out the reading operation, a high speed reading region can read the information stored in the memory cell array 303 by a one-time input of Vgs and the decision of the current, and furthermore, a region having a normal reading speed can further be stored in the same memory cell storing the high speed reading information. Therefore, it is possible to provide regions having different reading speeds in one flash memory without deteriorating the using efficiency of a memory cell array.

While the address to be the boundary among the normal reading region 401, the mixing region (normal reading region) 402 and the mixing region (high speed reading region) 403 which are divided is stored as the region information in the embodiment, the same advantages can be obtained even if information for each erasing unit of the memory cell array 303 and each word line is set to be the region information.

For the erasing and writing operations, first of all, the address signal 313 is input to the erasing control circuit 306, the information of the region information storage region 310 and the address signal 313 are compared with each other through the erasing control circuit 306, and it is decided any of the normal reading region 401, the mixing region (normal reading region) 402 and the mixing region (high speed reading region) 403 is designated by the address indicated by the address signal 313. The information of the mixing region (normal reading region) 402 is transferred to the data saving memory 302 when a region to be an erasing target is the normal reading region 401, and the information of the normal reading region 401 is transferred to the data saving memory 302 when the region to be the erasing target is the mixing region (normal reading region) 402, and thereafter, an erasing operation is carried out.

In a writing operation, subsequently, information corresponding to the saved data and information to be written are synthesized by the writing control circuit 307 and a writing operation is carried out over an address to be a writing target input by the address signal 313.

By carrying out the erasing and writing operations, it is possible to perform erase and write without damaging the information for an optional region.

While the description has been given to the multivalued flash memory storing 2-bit information in one memory cell, it is possible to implement the same structure for a flash memory storing information of 3 bits or more. In this case, it is possible to set regions having three reading speeds.

While the data saving memory 302 to be used in the erase and write is set to be another chip, it is a matter of course that the same advantages can be obtained even if another memory region in the same chip is used.

Second Embodiment

A second embodiment according to the invention will be described.

Figure 7:
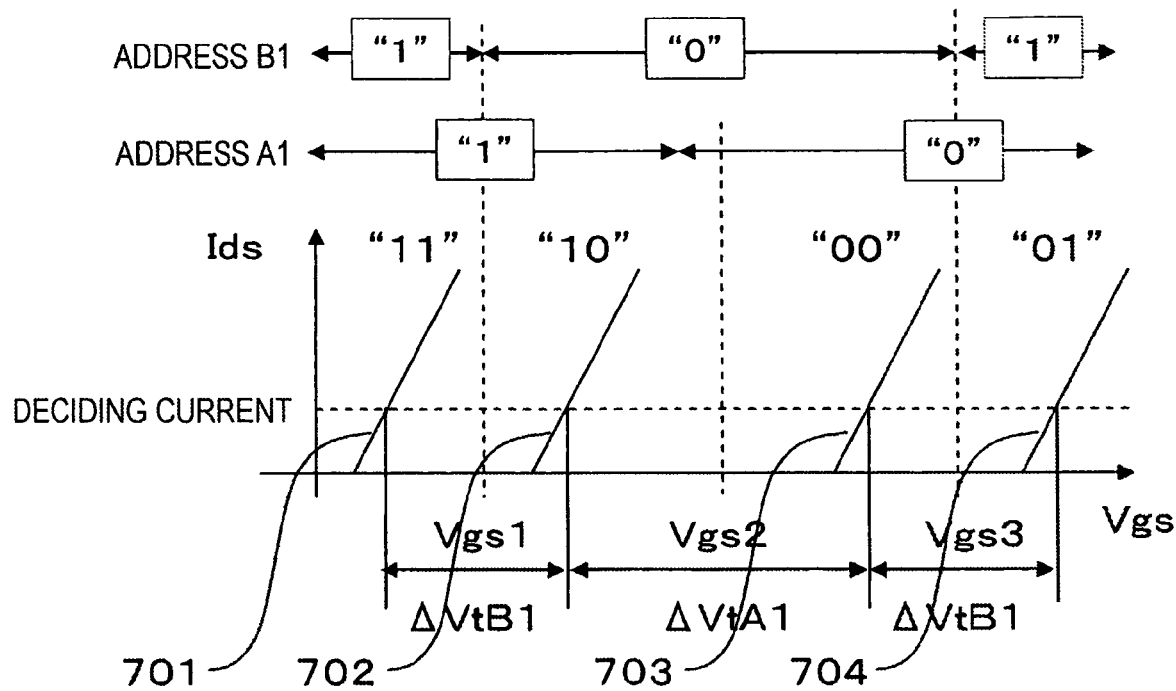
FIG. 7 is a chart showing setting of a threshold of a flash memory in the case in which a voltage of a difference in a threshold corresponding to a reading operation of a memory cell in a high speed reading region is set to be high and an Ids-Vgs characteristic corresponding to information stored in each address in a flash memory according to a second embodiment of the invention.

FIG. 7 is a chart showing setting of a threshold of a memory cell in a multivalued flash memory according to a second embodiment of the invention.

FIG. 7 shows a flash memory for storing four values in the same manner as FIG. 1, and a state in which "1" is stored in an address A1 and "1" is stored in an address B1 is set to be a state of the smallest threshold indicated as an Ids-Vgs characteristic 701 shown in FIG. 7, and a state in which "1" is stored in the address A1 and "0" is stored in the address B1 is set to be each threshold of an Ids-Vgs characteristic 702, a state in which "0" is stored in the address A1 and "0" is stored in the address B1 is set to be each threshold of an Ids-Vgs characteristic 703, and a state in which "0" is stored in the address A1 and "1" is stored in the address B1 is set to be each threshold of an Ids-Vgs characteristic 704 in ascending order of the threshold.

In this case, a difference in a threshold Δ VtA1 between the Ids-Vgs characteristics 702 and 703 obtained when the address A1 is to be read is set to be greater than a difference in a threshold Δ VtB1 between the Ids-Vgs characteristics 701 and 702 and a difference in a threshold ΔVtB1 between the Ids-Vgs characteristics 703 and 704 which are obtained when the address B1 is to be read.

With the structure, it is desirable that the normal region 305 as well as the mixing region 304 in FIG. 3 should also be set in the same manner.

Since the other structures are the same as those in the first embodiment, description will be omitted.

By using the structure, it is possible to carry out reading at a higher speed for a high speed reading region. Furthermore, it is possible to reduce an influence due to leaving or various disturbances and to enhance a reliability.

Third Embodiment

Description will be given to a third embodiment according to the invention.

Figure 8:
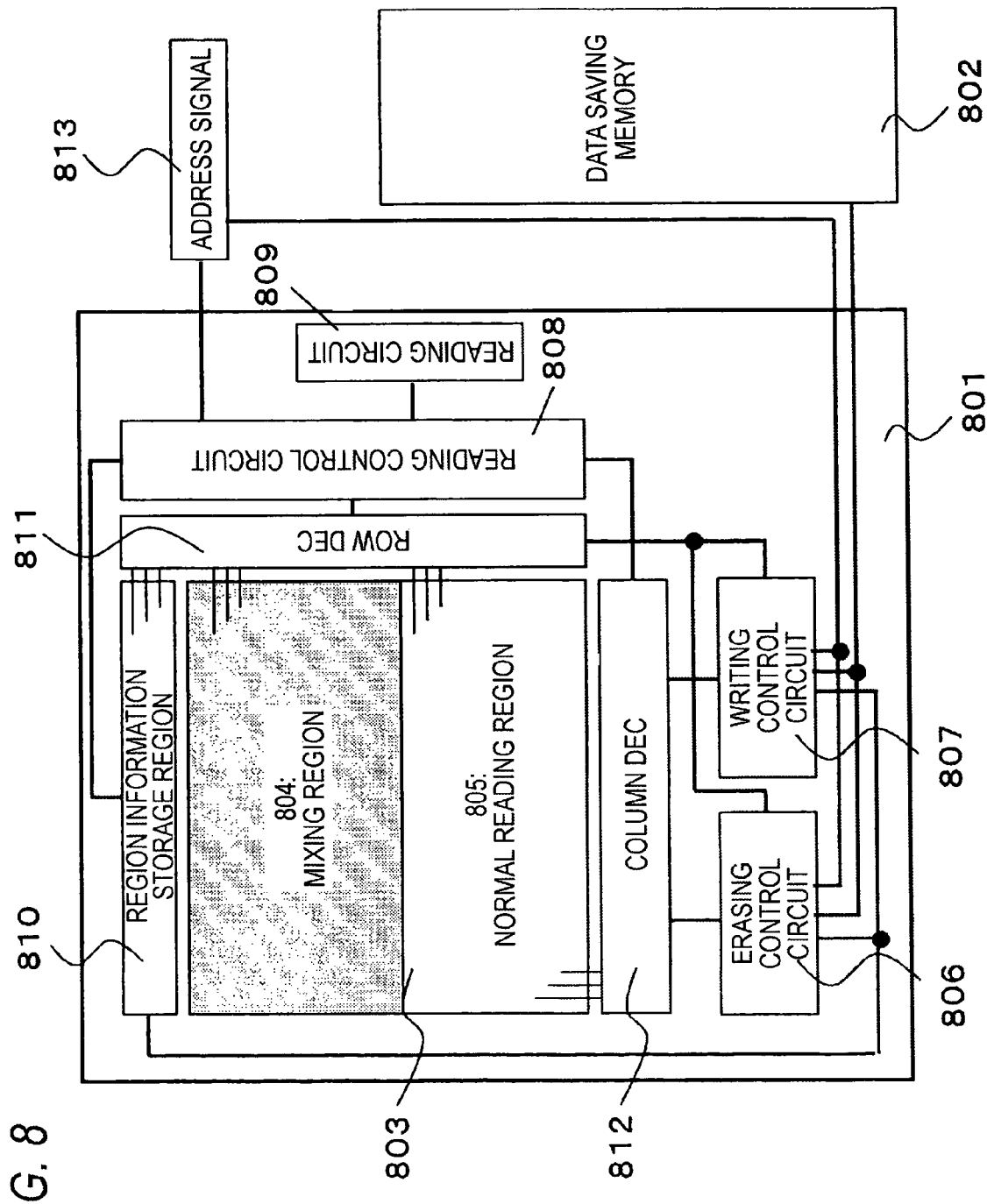
FIG. 8 is a diagram showing a structure in which a nonvolatile memory is employed in a region information storage region according to a third embodiment of the invention.

FIG. 8 is a diagram showing a structure of a flash memory according to the third embodiment of the invention.

The flash memory according to the embodiment is constituted by a flash memory chip 801 and a data saving memory 802 for once saving data in writing as shown in FIG. 8, and a separate memory chip from the flash memory chip 801 is used.

In contrast to the structure described in the first embodiment with reference to FIG. 3, in the embodiment, a region information storage region 810 having an electrically writable/erasable structure is employed in place of the region information storage region 310, and the same structure as that of a memory cell array 803 is desirable.

The other operations are the same as those in the first embodiment.

With such a structure, a high speed reading region in a mixing region and a normal reading operation region and a normal reading region in the mixing region within the region information storage region 810 are compared with an address signal 813, and region information for carrying out each of reading, erasing and writing operations can be set by a user after a shipment of a product and a capacity of each of the regions can be determined.

More specifically, in one memory cell, the memory cell array 803 including a plurality of multivalued memory cells capable of storing 2-bit information has a mixing region 804 in which a high speed reading region and a region having a normal reading speed are mixed and a normal reading operation region 805 having a normal reading speed in the memory cell array. In the mixing region 804, the threshold of the memory cell and the region are set as described with reference to FIG. 1.

Furthermore, there are provided an erasing control circuit 806 for erasing the memory cell array 803, a writing control circuit 807 for carrying out write to the memory cell array 803, and a reading control circuit 808 for carrying out a reading operation for the memory cell array 803, and a reading circuit 809 is controlled.

A region information storage region 810 stores information for discriminating the mixing region 804 and the normal reading region 805 in the memory cell array 803, and has the same structure as that in the memory cell array 803 and can carry out electrical write/erase.

There are provided a Row decoder 811 for selecting a word line of the memory cell array 803 and a Column decoder 812 for selecting a bit line.

Moreover, an address for carrying out each of reading, erasing and writing operations for the flash memory chip 801 is specified in response to the address signal 813.

In the embodiment, the region information storage region 810 having an electrically writable/erasable structure is simply employed in place of the region information storage region 310 for the structure described in the first embodiment with reference to FIG. 3, and it is desirable that the other portions should have the same structures as those of the memory cell array 803.

The other operations are the same as those in the first embodiment.

By such a structure, the high speed reading region in the mixing region, the normal reading operation region in the mixing region and the normal reading region within the region information storage region 810 are compared with the address signal 813, and the region information for carrying out each of the reading, erasing and writing operations can be set by a user after a shipment of a product and a capacity of each region can be determined.

Fourth Embodiment

Description will be given to a fourth embodiment according to the invention.

Figure 9:
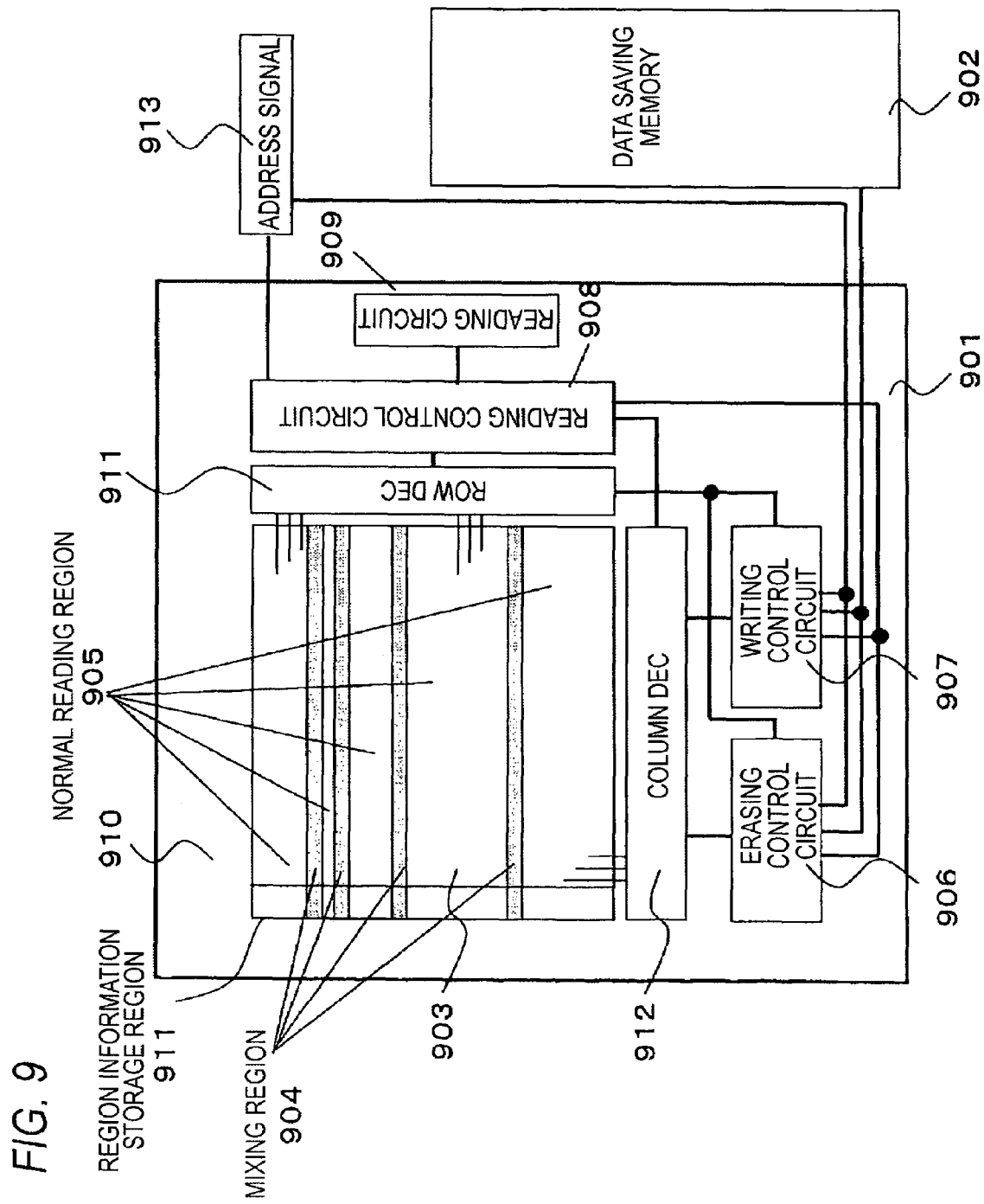
FIG. 9 is a diagram showing a structure in which a region information storage region according to a fourth embodiment of the invention is provided for each word line in a memory cell array.
Figure 10:
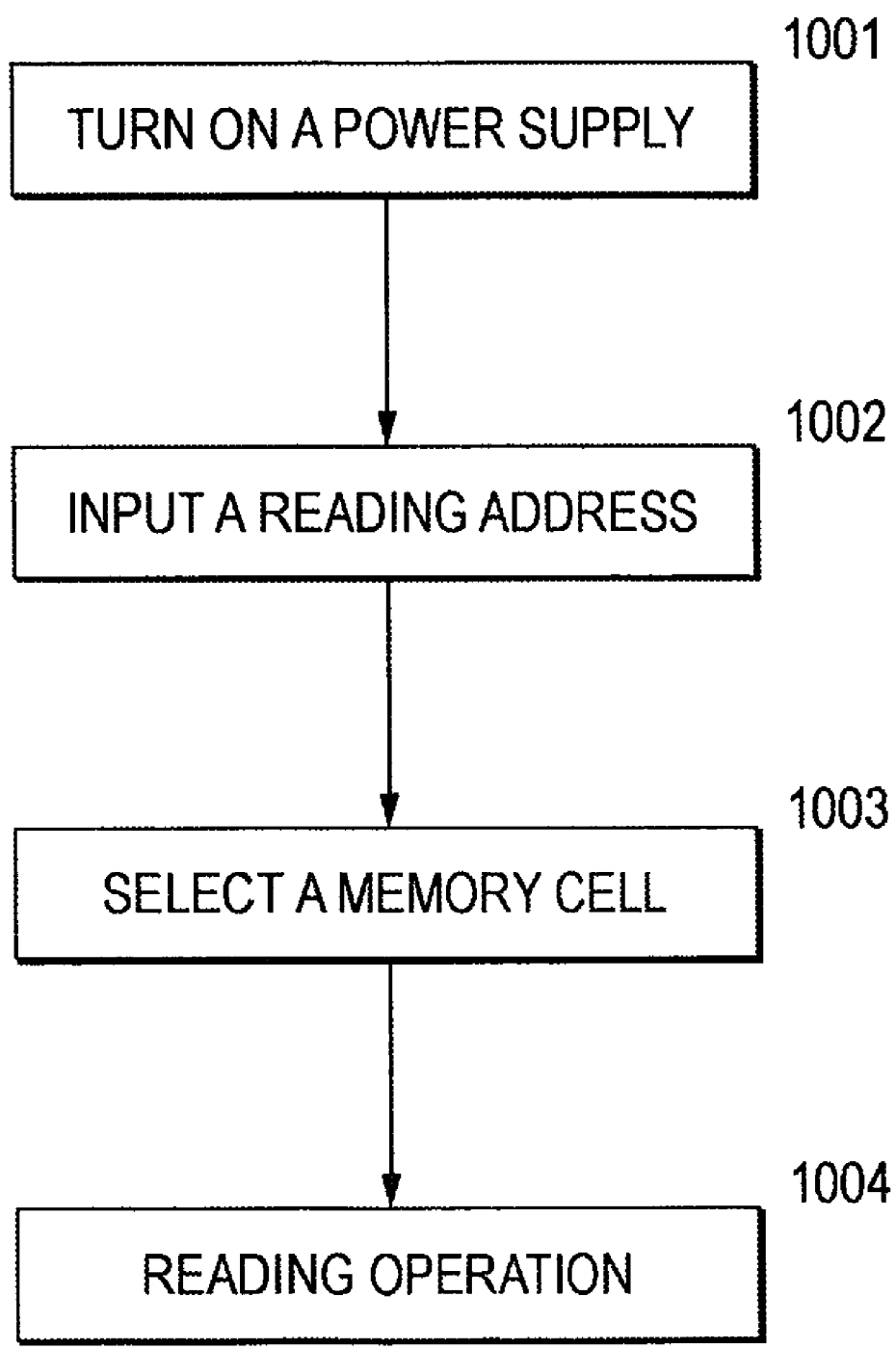
FIG. 10 is a flowchart showing a reading operation of a flash memory according to a conventional example.
Figure 11:
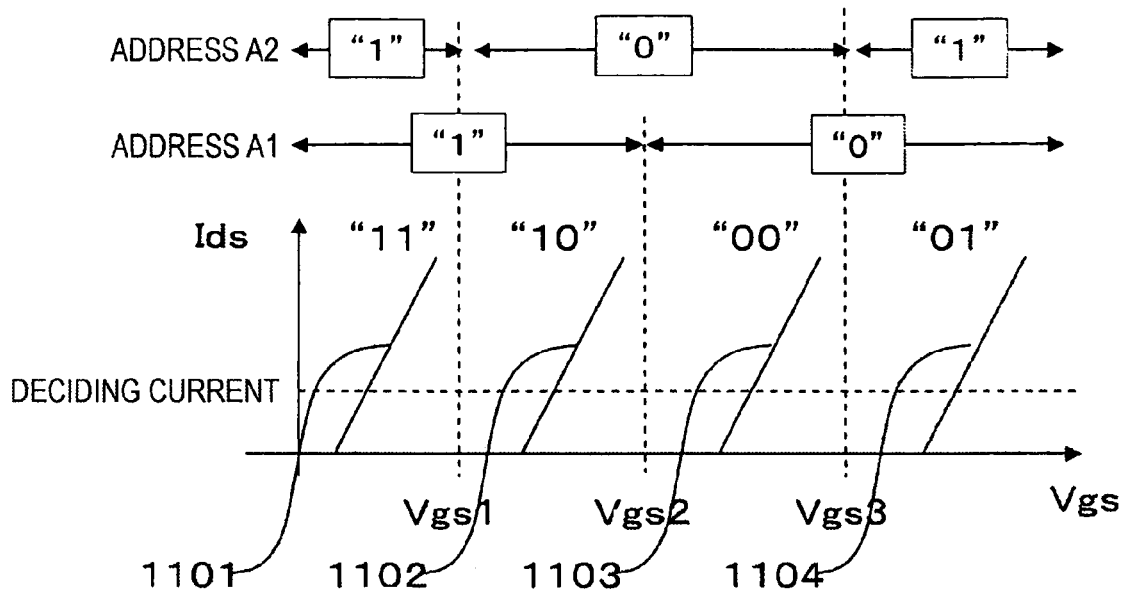
FIG. 11 is a chart showing setting of a threshold of a multivalued flash memory according to the conventional example.
Figure 12:
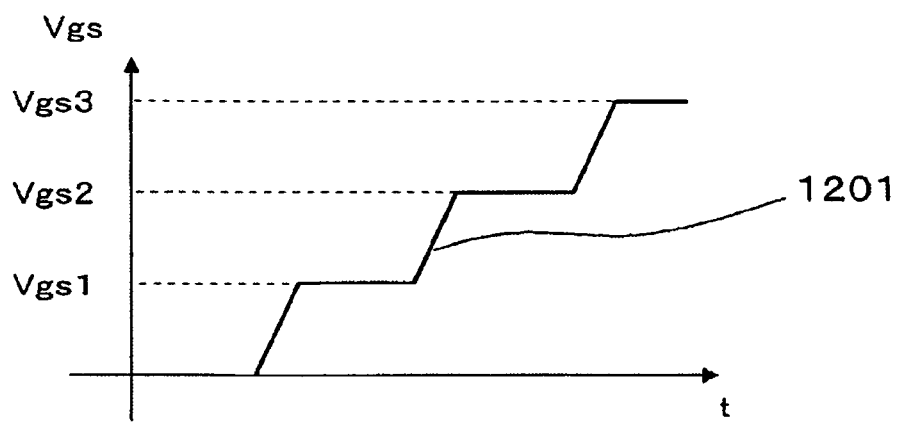
FIG. 12 is a chart showing a Vgs-t transition in the case in which the multivalued flash memory according to the conventional example is read and a correspondence of a state of Ids in each Vgs to stored information.
Figure 13:
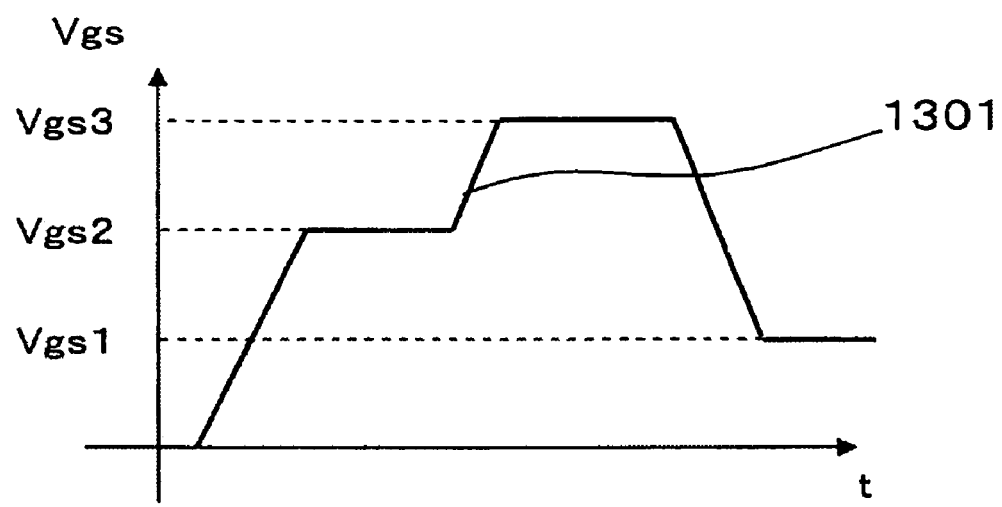
FIG. 13 is a chart showing the Vgs-t transition in the case in which the multivalued flash memory according to the conventional example is read and the correspondence of the state of Ids in each Vgs to the stored information.

FIG. 9 is a diagram showing a structure of a flash memory according to the embodiment.

The flash memory according to the embodiment comprises a flash memory chip 901 and a data saving memory 902 for once saving data in writing, and the data saving memory 902 is a separate memory chip from the flash memory chip 901 as shown in FIG. 9.

A memory cell array 903 includes a plurality of multivalued memory cells capable of storing 2-bit information. In the memory cell array 903, there are a mixing region 904 having a high speed reading region and a region having a normal reading speed which are mixed and a normal reading operation region 905 having a normal reading speed. In the embodiment, a discrete arrangement is carried out and the threshold of the memory cell and the region are set as described with reference to FIG. 1.

Furthermore, there are provided an erasing control circuit 906 for erasing the memory cell array 903, a writing control circuit 907 for carrying out write to the memory cell array 903, and a reading control circuit 908 for carrying out a reading operation for the memory cell array 903, and the control of a reading circuit 909 is achieved.

In the embodiment, a region information storage region stores information for discriminating the mixing region 904 and the normal reading region 905 in the memory cell array 903, and one bit is assigned to each word line in the memory cell array 903.

Furthermore, a Row decoder 911 serves to select a word line of the memory cell array 903 and a Column decoder 912 serves to select a bit line.

Moreover, an address signal 913 represents an address signal for specifying an address to carry out each of reading, erasing and writing operations for the flash memory chip 901.

In the embodiment, the region information storage region 810 is set to have the same structure as that of the memory cell array 903 for the structure described in the third embodiment with reference to FIG. 8, and furthermore, region information is stored in one bit for each word line to set the region information storage region.

The other operations are the same as those in the first embodiment.

In the embodiment, the high speed reading region in the mixing region, the normal reading operation region in the mixing region and the normal reading region within the region information storage region 910 are compared with the address signal 913, and the information for carrying out each of the reading, erasing and writing operations can be freely set by a user after a shipment of a product and the information can be stored in the region information storage region without waste.

In case of a flash memory chip storing information of 3 bits or more in one memory cell and having three reading speeds or more, particularly, it is possible to set the region in a plurality of combinations.

In a nonvolatile memory according to the invention, uses for program storage and uses for data storage can be implemented in one chip. Therefore, the nonvolatile memory can be applied to be incorporated into a necessary set apparatus for both of the uses.

What is claimed is:

1. A nonvolatile semiconductor storage apparatus comprising:
    a memory cell array including a plurality of memory cells capable of storing information of 2 bits or more in one memory cell;
    a writing control circuit for controlling a writing operation to the memory cell array;
    an erasing control circuit for controlling an erasing operation;
    a reading control circuit for controlling a reading operation; and
    a reading circuit capable of applying a plurality of reading methods,
    wherein the memory cell array is logically divided into a plurality of regions having different reading speeds, and the respective regions having the different reading speeds include region information storage regions for storing region information in which at least two addresses present in the memory cell at the same time are set to be different regions; and
    the reading control circuit is constituted to carry out a reading operation by determining any of the divided regions which is to be read, selecting an optimum reading method and controlling the reading circuit based on the region information stored in the region information storage region.

2. The nonvolatile semiconductor storage apparatus according to claim 1, further comprising a data saving memory,
    the erasing control circuit being constituted to once save, in the data saving memory, information which is not required to be rewritten and to then carry out an erasing operation when the information which is not required to be rewritten is stored in a memory cell in a region to which a request for rewrite is given, and
    the writing control circuit being constituted to add the saved information to information to be newly written, to determine a threshold to be written to a memory cell to be a writing target and to carry out a writing operation.

3. The nonvolatile semiconductor storage apparatus according to claim 2, wherein the threshold for the memory cell is set in such a manner that a difference in a threshold corresponding to an address to be read at a high speed is greater than a difference in a threshold corresponding to an address to be read at a low speed.

4. The nonvolatile semiconductor storage apparatus according to claim 1, wherein the region information is constituted by an electrically writable/erasable nonvolatile semiconductor memory.

5. The nonvolatile semiconductor storage apparatus according to claim 1, wherein the regions having the different reading speeds are divided as one continuous address region for the respective reading speeds, and the region information storage region stores, as the region information, an address to be a boundary between the divided regions.

6. The nonvolatile semiconductor storage apparatus according to claim 1, wherein the regions having the different reading speeds are divided for each erasing unit in the memory cell array, and the region information is stored for the each erasing unit.

7. The nonvolatile semiconductor storage apparatus according to claim 1, wherein the regions having the different reading speeds are divided for each word line in the memory cell array, and the region information is stored for each word line.

8. The nonvolatile semiconductor storage apparatus according to claim 7, wherein the region information is stored in a memory cell present in the same word line as the memory cell in the divided region.

9. A method of driving a nonvolatile semiconductor storage apparatus comprising a memory cell array including a plurality of memory cells capable of storing information of two bits or more in one memory cell, comprising the steps of:
    logically dividing the memory cell array into a plurality of regions having different reading speeds and storing, in a region information storage region, region information in which the respective regions having the different reading speeds set at least two addresses present at the same time in the memory cell to be different regions;
    determining to read any of the divided regions based on the region information stored in the region information storage region; and
    selecting an optimum reading method for the region determined at the determining step and carrying out a reading operation.

* * * * *